United States Patent [19]

Woo

[11] Patent Number: 5,132,572

[45] Date of Patent: Jul. 21, 1992

[54] HIGH-SPEED CMOS-TO-ECL TRANSLATOR CIRCUIT

[75] Inventor: Ann K. Woo, Cupertino, Calif.

[73] Assignee: Advanced Micro Devices, Inc., Sunnyvale, Calif.

[21] Appl. No.: 743,944

[22] Filed: Aug. 12, 1991

[51] Int. Cl.$^5$ .............................................. H03K 19/00
[52] U.S. Cl. .................................. 307/475; 307/446; 307/448; 307/455
[58] Field of Search ............... 307/443, 446, 448, 451, 307/455, 475

[56] References Cited

U.S. PATENT DOCUMENTS

| | | | |
|---|---|---|---|
| 4,656,375 | 4/1987 | Lauffer et al. | 307/475 |
| 4,704,549 | 11/1987 | Sanwo et al. | 307/475 |
| 4,947,061 | 8/1990 | Metz et al. | 307/455 |
| 5,036,224 | 7/1991 | Wendell | 307/475 |
| 5,043,604 | 8/1991 | Komaki | 307/455 |
| 5,047,671 | 9/1991 | Suthar et al. | 307/475 |
| 5,084,637 | 1/1992 | Gregor | 307/475 |

Primary Examiner—Robert J. Pascal
Attorney, Agent, or Firm—Davis Chin

[57] ABSTRACT

A high-speed CMOS-to-ECL translator circuit for receiving CMOS complementary input signals and for converting the CMOS input signals to ECL differential output signals includes a differential pair of MOS input transistors (N4,N3), a constant current source ($I_s$), a first output stage, and a second output stage. The first output stage is formed of a first MOS output transistor (N2) and a second MOS output transistor (P1). The second output stage is formed of a third MOS output transistor (N2) and a fourth MOS output transistor (P2). The gates of the first and second input transistors (N4, N3) are responsive to the CMOS complementary input signals (D, DB). The first output stage generates one of the ECL differential output signals (Q) at a first output terminal (18), and the second output stage generates the other one of the ECL differential output signals (QB) at a second output terminal (20). The translator circuit has an extremely short propagation delay time at its output terminals in response to input voltage changes applied to its input terminals.

9 Claims, 1 Drawing Sheet

HIGH-SPEED CMOS-TO-ECL TRANSLATOR CIRCUIT

BACKGROUND OF THE INVENTION

This invention relates generally to logic level translators and more particularly, it relates to a translator circuit for converting complementary metaloxide semiconductor (CMOS) logic level signals to emitter-coupled-logic (ECL) logic level signals which have a higher speed of operation than is traditionally available.

As is generally well known in the art, various types of digital logic circuitry are widely utilized in the area of computer data processing systems in different parts of the processing system. In order to transfer data from one part of the processing system having one logic type (i.e., CMOS) of integrated circuit devices to another part having another logic type (i.e., ECL) of integrated circuit devices, there is often required a translation from one logic type to the other logic type since they have different switching speeds and the input/output voltages corresponding to high and low logic levels are different. Since many of these processing systems are designed with both CMOS and ECL logic circuits, there are required interface circuits such as CMOS-to-ECL translators so that these two different types of logic circuits will be compatible with each other. In other words, the CMOS-to-ECL translators are used to shift the level of the CMOS input logic signals to a level which will be recognized by the ECL logic circuits.

A CMOS-to-ECL logic level translator 2 of the prior art is shown in FIG. 1 and has been labeled "Prior Art." With the advent of advanced process technologies, the N-type MOS transistors N3, N4 and the bipolar transistors Q1, Q2 used in the circuit of FIG. 1 may now be prepared on a single semiconductor chip through a known CMOS fabrication process. In particular, each of the NPN-type bipolar transistors Q1 and Q2 is made as a vertical transistor by utilizing the n region (source or drain) of the N-type MOS transistor as an emitter, the p-well region as the base and the n substrate as a collector.

The logic level translator 2 can convert the CMOS complementary input signals D and DB applied to respective input terminals 4, 6 (gates of the MOS transistors N4, N3) into ECL differential output signals Q and QB at the respective output terminals 8, 10. However, if the switching speed is required to be extremely fast (i.e., in the order of one or two nanoseconds), the bipolar transistors Q1, Q2 will not be able to switch fast enough since the CMOS fabrication process has not been optimized to produce high speed bipolar transistors. Thus, the prior art translator 2 has the disadvantage of being slow. Since speed is a primary advantage of bipolar transistor devices, the slowness of the prior art translator is a serious problem.

Accordingly, there has arisen a need in the industry to provide a logic level translator circuit which has a high speed of operation and is compatible in a CMOS-ECL integrated circuit. The logic level translator circuit of the present invention is an improvement over the prior art translator of FIG. 1. The present translator circuit has a propagation delay during a low-to-high or high-to-low output transition at its output terminal which is reduced to approximately 1-2 ns over the translator of FIG. 1.

SUMMARY OF THE INVENTION

Accordingly, it is a general object of the present invention to provide an improved CMOS-to-ECL logic level translator circuit which is relatively simple and economical to manufacture and assemble, but yet overcomes the disadvantages of the prior art translators.

It is an object of the present invention to provide a logic level translator for converting CMOS logic level signals to ECL logic level signals which has a higher speed of operation than is traditionally available.

It is another object of the present invention to provide a high-speed translator circuit for receiving CMOS complementary input level signals and for generating differential output signals that are ECL compatible.

In accordance with these aims and objectives, the present invention is concerned with the provision of a high-speed CMOS-to-ECL translator circuit for receiving CMOS complementary input signals and for converting the CMOS input signals to ECL differential output signals which includes a differential pair of first and second input transistors, a constant current source, a first output stage, and a second output stage. The first input transistor has its drain connected to an upper supply potential via a first load resistor and its gate connected to a first input terminal for receiving one of the CMOS complementary input signals. The second input transistor has its drain connected to the upper supply potential via a second load resistor and its gate connected to a second input terminal for receiving the other one of the CMOS complementary input signals.

The constant current source is connected between the sources of the first and second input transistors and a lower supply potential. The first output stage is formed of a first output transistor and a second output transistor. The first output transistor has its drain connected to the upper supply potential, its gate connected to the drain of the second input transistor and its source connected to the drain of the second output transistor. The second output transistor has its source connected to the upper supply potential and its drain also connected to a first output terminal for generating one of the ECL differential output signals. A third load resistor has its one end connected to the first output terminal and its other end connected to the lower supply potential.

The second output stage is formed of a third output transistor and a fourth output transistor. The third output transistor has its drain connected to the upper supply potential, its gate connected to the drain of the first input transistor and its source connected to the drain of the fourth output transistor. The fourth output transistor has its source connected to the upper supply potential and its drain also connected to the second output terminal for generating the other one of the ECL differential output signals. A fourth load resistor has its one end connected to the second output terminal and its other end connected to the lower supply potential.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figures 1, 2, 3, 4:
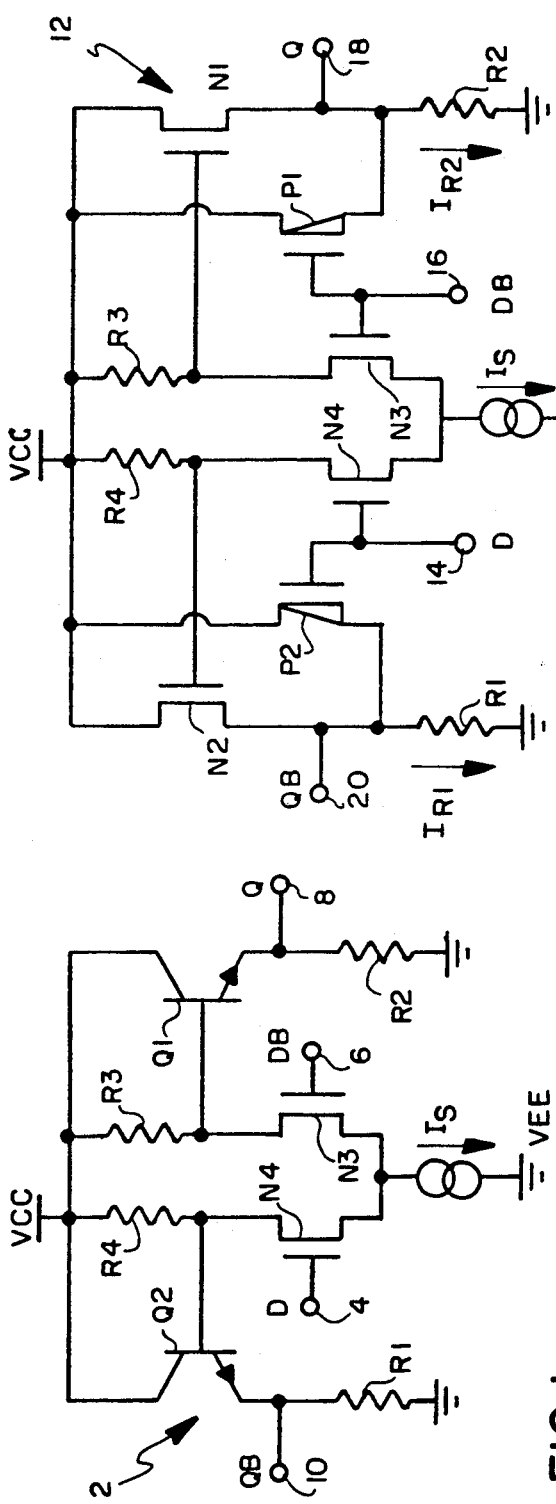
FIG. 1 is a schematic circuit diagram of a prior art logic level translator.
FIG. 2 is a schematic circuit diagram of a high-speed CMOS-to-ECL logic level translator circuit, constructed in accordance with the principles of the present invention.
FIG. 3 is a schematic circuit diagram of a second embodiment of a translator circuit of the present invention.
FIG. 4 is a graph illustrating a response characteristic of the translator circuit of FIG. 2.

Referring now in detail to the drawings, there is illustrated in FIG. 2 a schematic circuit diagram of a high-speed CMOS-to-ECL logic level translator circuit 12 of the present invention for receiving CMOS complementary input signals and for converting the CMOS input signals to ECL differential output signals. The translator circuit 12 has first and second input terminals 14 and 16 for receiving the respective CMOS complementary input signals D and DB. The input signals D and DB have a full voltage swing from a lower supply potential at a first supply voltage or potential VEE to an upper supply potential at a second supply voltage or potential VCC. Typically, the lower supply potential is 0 volts and the upper supply potential is at approximately +5.0 volts ±10% for conventional CMOS logic. The translator circuit 12 further has first and second output terminals 18 and 20 for producing the respective ECL differential output signals Q and QB which have a smaller voltage swing of approximately 800 mV so as to be compatible with ECL devices.

The translator circuit 12 includes a pair of N-type MOS input transistors N4 and N3 which are used as a differential pair. The gates of the MOS transistors N4 and N3 are connected, respectively, to the input terminals 14 and 16 for receiving the CMOS input signal D and the inverted or complemented CMOS input signal DB. The transistors N4 and N3 have their sources connected together. A constant current source $I_S$ is connected between the common sources of the transistors N4, N3 and the lower supply potential VEE. The drain of the input transistor N4 is connected to the upper supply potential VCC via a first load resistor R4. The drain of the input transistor N3 is also connected to the upper supply potential VCC via a second load resistor R3.

The translator circuit 12 further includes a first output stage formed of a pair of output transistors N1, P1 and a second output stage formed of a pair of output transistors N2, P2. The N-channel output transistor N1 has its drain connected to the upper supply potential VCC, its gate connected to the drain of the input transistor N3, and its source connected to the first output terminal 18. The P-channel pull-up transistor P1 has its source connected to the upper supply potential VCC, its gate connected to the second input terminal 16 and its drain connected to the first output terminal 18. A third load resistor R2 has its one end connected to the first output terminal 18 and its other end connected to the lower supply potential VEE.

The N-channel output transistor N2 has its drain connected to the upper supply potential VCC, its gate connected to the drain of the input transistor N4, and its source connected to the second output terminal 20. The P-channel pull-up transistor P2 has its source connected to the upper supply potential VCC, its gate connected to the first input terminal 14, and its drain connected to the second output terminal 20. A fourth load resistor R1 has its one end connected to the second output terminal 20 and its other end connected to the lower supply potential VEE. The switching speed of these first and second pairs of output transistors (N1, P1) and (N2, P2) will be as fast as any part of the translator circuit which has been optimized by the CMOS fabrication process.

In operation, the input transistors N4 and N3 are turned ON and OFF by voltage differences between the CMOS input signal D and CMOS complemented input signal DB applied to the respective input terminals 14 and 16. For example, when the input signal D is at a low or "0" logic level and the complemented input signal DB is at the high or "1" logic level, the first MOS input transistor N4 is turned off and the second MOS input transistor N3 is turned on. Further, the pull-down transistor P1 will be turned off and the pull-down transistor P2 will be turned on. As a result, a low output voltage $V_{OL}$ will be generated at the first output terminal 18 (Q) and a high output voltage $V_{OH}$ will be generated at the second output terminal 20 (QB).

The low output voltage $V_{OL}$ is determined by the voltage drop across the load resistor R3 and the gate-source voltage drop of the output transistor N1. Thus, the output voltage $V_{OL}$ can be expressed by:

$$V_{OL} = VCC - I_S R_3 - V_{GS}|_{N1 \text{ at } IR2}$$

where

VCC = the upper supply potential $I_S$ = the current flowing through the resistor $R_3$ $V_{GS}$ = the gate-source voltage drop across the transistor N1 with the current $I_{R2}$, flowing through the resistor $R_2$ The high output voltage Vox is determined by the drain-source voltage drop of the pull-up transistor P2 and can be expressed by:

$$V_{OH} = VCC - V_{DS}|_{P2 \text{ at } IR1}$$

where

VCC = the upper supply potential $V_{DS}$ = the drain-source voltage drop across the transistor P2 with the current $I_{R1}$ flowing through the resistor $R_1$ Similarly, when the input signal D is at a high or "1" logic level and the complemented input signal DB is at the low or "0" logic level, the first MOS input transistor N4 is turned on and the second MOS input transistor N3 is turned off. Further, the pull-down transistor P2 will be turned off and the pull-down transistor P1 will be turned on. As a result, the low output voltage $V_{OL}$ will be generated at the second output terminal 20 (QB) and the high output voltage $V_{OH}$ will be generated at the first output terminal 18 (Q).

FIG. 4 shows a response characteristic of the translator circuit 12 of the present invention as plotted by a SPICE simulation. With one micron CMOS fabrication process, the value of the resistors R1-R4 were chosen to be all equal to 300 Ω and the constant current source $I_S$ was set to 2 mA. The width dimensions of the N-channel transistors N1 and N2 were selected to be 200 microns, and the length dimensions thereof were selected to be 1 micron. The width dimensions of the P-channel transistors P1 and P2 were selected to be 600 microns and the length dimensions thereof were selected to be 1 micron. The simulation was connected with the upper supply potential VCC being at +5.0 volts.

With this translator circuit 12, when the CMOS input signal is varied in a range of 0.0 volts to +5.0 volts the output voltage varies in a range of +3.2 volts and 4.0 volts, which is an ECL voltage swing of 0.8 volts. The translator circuit produces the low output voltage $V_{OL} = +3.2$ volts for the input voltage of 0.0 volts and produces the high output voltage $V_{OH} = +4.0$ volts for the input voltage of +5.0 volts. As can be seen from FIG. 4, the translator circuit 12 responds to a change in the input voltage (curve 22) with an extremely short propagation delay time of less than 1 ns before changing its output voltage (curve 24).

While the voltage swing of 0.8 volts between the two ECL logic levels of +3.2 volts and +4.0 volts is depicted in simulation of FIG. 4, it should be apparent to those skilled in the art that different voltage swings can be obtained by utilizing different values of resistors (R1-R4), varying the sizes of the transistors (N1, P1, N2, P2), and adjusting the current in the current source $I_S$. In this manner, the entire range of the voltage swing also may be moved up and down as desired by the circuit designer.

There is shown in FIG. 3 a second embodiment of a translator circuit 12a of the present invention. Referring to FIG. 3, the translator circuit 12a is a simplified version of the circuit of FIG. 2 in which the ECL output swing is very close to the upper supply potential VCC. By comparing FIG. 3 with FIG. 2, it can be seen that the differential transistor pair (N4, N3), resistors R3, R4 and the current source $I_S$ have been eliminated from FIG. 3. Further, the gates of the N-channel MOS input transistors N1 and N2 are tied directly to the upper supply potential VCC so as to render them always conductive. In operation, the CMOS complementary input signals D and DB applied to the gates (input terminals 14, 16) of the respective P-channel MOS transistors P2 and P1 are used to turn ON and OFF the transistors P2, P1. As a consequence, the ECL differential output signals Q and QB are produced through respective first and second output terminals 18 and 20.

From the foregoing detailed description, it can thus be seen that the present invention provides a high-speed CMOS-to-ECL translator circuit for receiving CMOS complementary input signals and for converting the CMOS input signals to ECL differential output signals. The translator circuit of the present invention has a high speed of operation and an extremely short propagation delay time at its output terminals in response to input voltage changes applied to its input terminals.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A high-speed CMOS-to-ECL translator circuit for receiving CMOS complementary input signals and for converting said CMOS input signals to ECL differential output signals, comprising:

a differential pair of first and second MOS input transistors (N4, N3), said first input transistor (N4) having its drain connected to an upper supply potential (VCC) via a first load resistor (R4) and its gate connected to a first input terminal (14) for receiving one of said CMOS complementary input signals (D), said second input transistor (N3) having its drain connected to said upper supply potential (VCC) via a second load resistor (R3) and its gate connected to a second input terminal (16) for receiving the other one of said CMOS complementary input signals (DB);

a constant current source ($I_S$) being connected between the sources of said first and second input transistors (N4, N3) and a lower supply potential (VEE);

a first output stage formed of a first MOS output transistor (N1) and a second output transistor (P1), said first output transistor (N1) having its drain connected to said upper supply potential (VCC), its gate connected to the drain of said second input transistor (N3) and its source connected to the drain of said second output transistor (P1), said second output transistor (P1) having its source connected to said upper supply potential (VCC) and its drain also connected to a first output terminal (18) for generating one of said ECL differential output signals (Q);

a third load resistor (R2) having its one end connected to said first output terminal (18) and its other end connected to said lower supply potential (VEE);

second stage formed of a third MOS output transistor (N2) and a fourth MOS output transistor (P2), said third output transistor (N2) having its drain connected to said upper supply potential (VCC), its gate connected to the drain of said first input transistor (N4) and its source connected to the drain of said fourth output transistor (P2), said fourth output transistor (P2) having its source connected to said upper supply potential (VCC) and its drain also connected to a second output terminal (20) for generating the other one of said ECL differential output signals (QB); and a fourth load resistor (R1) having its one end connected to said second output terminal (20) and its other end connected to said lower supply potential (VEE).

2. A translator circuit as claimed in claim 1, wherein said first and second input transistors (N4, N3) are N-channel MOS transistors.

3. A translator circuit as claimed in claim 2, wherein said first and third output transistors (N1, N2) are N-channel MOS transistors.

4. A translator circuit as claimed in claim 3, wherein said second and fourth output transistors (P1, P2) are P-channel MOS transistors.

5. A translator circuit as claimed in claim 4, wherein said upper supply potential (VCC) is at +5.0 volts, and wherein said lower supply potential (VEE) is at 0 volts.

6. A high-speed CMOS-to-ECL translator circuit for receiving CMOS complementary input signals and for converting said CMOS input signals to ECL differential output signals, comprising:
- a first MOS input transistor (P2) having its source connected to an upper supply potential (VCC) and its gate connected to a first input terminal (14) for receiving one of said CMOS complementary input signals (D);
- a second MOS input transistor (P1) having its source connected to said upper supply potential (VCC) and its gate connected to a second input terminal (16) for receiving the other one of said CMOS complementary input signals (DB);
- a first MOS output transistor (N1) having its gate and drain connected to said upper supply potential (VCC) and its source connected to the drain of said second input transistor (P1), said first output transistor (N1) having its source also connected to a first output terminal (18) for generating one of said ECL differential output signals (Q);
- a first load resistor (R2) having its one end connected to said first output terminal (18) and its other end connected to a lower supply potential (VEE);
- a second MOS output transistor (N2) having its gate and drain connected to said upper supply potential (VCC) and its source connected to the drain of said first input transistor (P2), said second output transistor (N2) having its source also connected to a second output terminal (20) for generating the other one of said ECL differential output signals (QB); and
- a second load resistor (R1) having its one end connected to said second output terminal (20) and its other end connected to said lower supply potential (VEE).

7. A translator circuit as claimed in claim 6, wherein said first and second input transistors (P2, P1) are P-channel MOS transistors.

8. A translator circuit as claimed in claim 7, wherein said first and second output transistors (N1, N2) are N-channel MOS transistors.

9. A translator circuit as claimed in claim 8, wherein said upper supply potential (VCC) is at +5.0 volts, and wherein said lower supply potential (VEE) is at 0 volts.

* * * * *

UNITED STATES PATENT AND TRADEMARK OFFICE
CERTIFICATE OF CORRECTION

PATENT NO.  : 5,132,572
DATED       : July 21, 1992
INVENTOR(S) : Ann K. Woo

It is certified that error appears in the above-identified patent and that said Letters Patent is hereby corrected as shown below:

Column 1, line 8, change "metaloxide" to --metal-oxide--.

Column 4, line 34, delete ",".

Column 4, line 36, change "$V_{oX}$" to -- $V_{OH}$ --.

Signed and Sealed this

Twenty-fourth Day of August, 1993

Attest:

BRUCE LEHMAN

Attesting Officer

Commissioner of Patents and Trademarks